United States Patent
Ebeling

(12) 
(10) Patent No.: US 6,548,835 B1
(45) Date of Patent: Apr. 15, 2003

(54) OPTOELECTRONIC DEVICE HAVING A HIGHLY CONDUCTIVE CARRIER TUNNELING CURRENT APERTURE

(75) Inventor: Karl Joachim Ebeling, Ulm (DE)

(73) Assignee: U-L-M photonics GmbH, Ulm (DE)

( * ) Notice: Subject to any disclaimer, the term of this patent is extended or adjusted under 35 U.S.C. 154(b) by 95 days.

(21) Appl. No.: 09/704,346

(22) Filed: Nov. 2, 2000

(51) Int. Cl.[7] .............. H01L 33/00; H01S 5/00
(52) U.S. Cl. .............. 257/94; 257/12; 257/13; 257/14; 257/79; 372/45; 372/46; 438/22; 438/24
(58) Field of Search .............. 257/12, 13, 14, 257/79, 89, 90, 94, 96, 97, 103, 616, 631, 632; 372/45, 46, 92, 96; 438/22, 24, 28, 46, 47

(56) References Cited

U.S. PATENT DOCUMENTS

| | | |
|---|---|---|
| 5,115,441 A | 5/1992 | Kopf et al. |
| 5,262,360 A | 11/1993 | Holonyak, Jr. et al. |
| 5,343,487 A | 8/1994 | Scott et al. |
| 5,373,522 A | 12/1994 | Holonyak, Jr. et al. |
| 5,412,680 A | 5/1995 | Swirhun et al. |
| 5,493,577 A | 2/1996 | Lear et al. |
| 5,567,980 A | 10/1996 | Holonyak, Jr. et al. |
| 5,594,751 A | 1/1997 | Scott |
| 5,696,023 A | 12/1997 | Holonyak, Jr. et al. |
| 5,936,266 A * | 8/1999 | Holonyak et al. .......... 257/106 |
| 6,014,400 A * | 1/2000 | Kobayashi ................... 372/44 |
| 6,026,111 A * | 2/2000 | Jiang et al. .................. 372/101 |
| 6,075,804 A * | 6/2000 | Deppe et al. ................ 372/46 |
| 6,266,357 B1 * | 7/2001 | Feld et al. .................... 372/45 |
| 6,269,109 B1 * | 7/2001 | Jewell ......................... 372/43 |
| 6,320,893 B1 * | 11/2001 | Ueki ............................ 372/45 |

FOREIGN PATENT DOCUMENTS

WO    9950939    10/1999

OTHER PUBLICATIONS

Small and Large Signal Modulation of 850 nm Oxide–Confined Vertical Cavity Surface Emitting Lasers.
Lear et al., 1997, Optical Society of America, OSA TOPS vol. 15 Advances in Vertical Cavity.
High–Speed Characteristics of Low–Optical Loss Oxide –Apertured Vertical–Cavity Lasers, Thibeault et al., 1997, IEEE, pp. 1041–1137.
Self–Stopping Selective–Oxidation Process of AlAs, Yoshikawa et al.
Applied Physics Letters, vol. 72, No. 18, 1998.
Design and Analysis of Single–Mode Oxidized VCSEL's for High–Speed Optical Interconnects, Wiedenmann et al., 1999, IEEE, pp. 1077–260X.

* cited by examiner

*Primary Examiner*—Tom Thomas
*Assistant Examiner*—Donghee Kang
(74) *Attorney, Agent, or Firm*—Volpe and Koenig, P.C.

(57) ABSTRACT

An optoelectronic device having a highly conductive carrier tunneling current aperture. The device includes a centrally positioned current aperture formed from a quantum layer made of a III-IV-V semiconductor compound, which is doped with a first doping type. The current aperture is laterally confined by an oxide of the III-IV-V semiconductor compound. Adjacent layers are also formed of a semiconductor material that is doped with the first doping type.

11 Claims, 1 Drawing Sheet

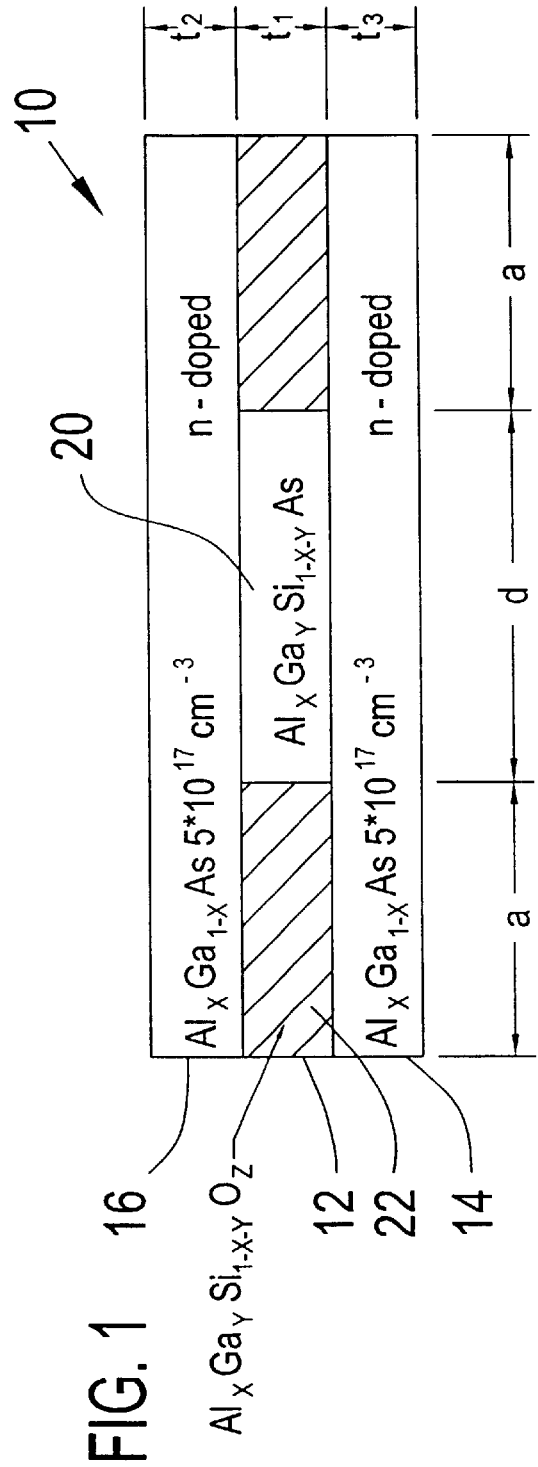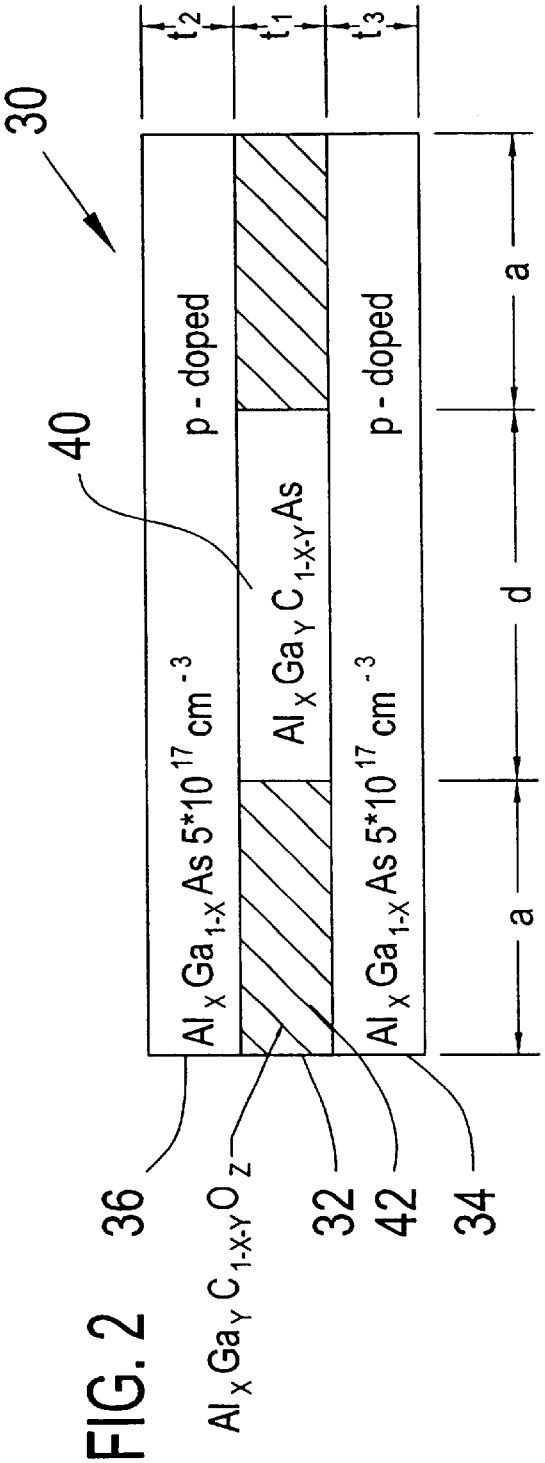

OPTOELECTRONIC DEVICE HAVING A HIGHLY CONDUCTIVE CARRIER TUNNELING CURRENT APERTURE

BACKGROUND

The present invention relates to optoelectronic devices which generate a light emission, and more particularly, to a highly conductive carrier tunneling current aperture for laser diodes and related optoelectronic devices.

Highly efficient laser diodes, especially those having a vertical resonator and producing transverse single mode emissions, require transverse current constriction to a diameter of 10 microns or less. The additional voltage drop due to the presence of the current aperture results in an increased threshold voltage. Channeling the injected current through such small areas also generates additional heat inside the device. The more heat that is generated, the lower maximum optical output power due to the thermal rollover of the light-current-curve. The heat generated inside the device is also responsible for the presence of a thermal induced lens which enhances the creation of undesirable high-order transverse modes. Variations of the radial distribution of the complex refractive index (both real and imaginary parts) induced by the aperture results in scattering losses.

Previously known techniques for current confinement in laser diodes are mesa etching or proton implantation. In vertical cavity surface emitting lasers (VCSELs) as well as edge-emitting devices, very high electro-optical conversion efficiencies are achieved by constricting the current via selectively oxidized apertures. In VCSELs formed from type III-V semiconductor material systems, like InAlGaAs, often the oxidation of the aluminum containing layers is used, as disclosed by U.S. Pat. No. 5,262,360. These high aluminum content layers are generally surrounded by layers of far less aluminum content. During oxidation, aluminum arsenide (AlAs) is transformed into $Al_xO_y$ layers with thicknesses usually below 100 nm. Current flow through the aperture perpendicular to the individual planes of the layers is limited by electrical resistance of the aluminum containing layers inside the aperture, except in very thin layers where the limitation is almost exclusively a function of the heterojunctions between the layers having high and low aluminum content. Due to the step in the refractive index at the perimeter of the aperture, considerable scattering of the optical wave is induced, resulting in increased resonator losses. Shrinkage of the $Al_xO_y$ layer also leads to strain in the semiconductor crystal, which has a negative effect on the stability and life of the device.

SUMMARY

The present invention provides an optoelectronic device having a highly conductive carrier tunneling current aperture. The device includes a centrally positioned current aperture formed from a quantum layer made of a III-IV-V semiconductor compound, which is doped with a first doping type. The current aperture is laterally confined by an oxide of the III-IV-V semiconductor compound. Adjacent layers are also formed of a semiconductor material that is doped with the first doping type.

The use of the III-IV-V semiconductor compound provides the highest possible electrical conductivity in the current aperture opening, with minimal optical losses due to scattering and defraction of the oscillating mode. Additionally, internal stresses created during the formation of the aperture are minimized in the multilayer semiconductor structure due to the reduced change in size of the oxide of the III-IV-V semiconductor material in comparison to the previously used III-V semiconductor materials.

BRIEF DESCRIPTION OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 1 is a side cross-sectional view of an n-doped carrier tunneling current aperture in accordance with a first preferred embodiment of the invention; and FIG. 2 is a side cross-sectional view of a p-doped carrier tunneling current aperture in accordance with a second preferred embodiment of the present invention.

DETAILED DESCRIPTION OF THE PREFERRED EMBODIMENTS

Referring now to FIG. 1, a highly conductive carrier tunneling aperture for use in an optoelectronic device 10 (only a portion of which is represented), such as a VCSEL, for example as described in U.S. Pat. Nos. 5,262,360 or 5,594,751, is shown. The current aperture is formed from a centered strained quantum barrier layer made of a III-IV-V semiconductor compound formed in a layer 12. The first preferred embodiment of the current aperture is for electrons, and the III-IV-V semiconductor compound is preferably formed of $Al_XGa_YSi_{1-X-Y}As$ into the layer 12, where X and Y are less than 1 and X+Y is also less than 1. In this type of semiconductor, amphoteric Si atoms are located at the group III as well as the group V lattice sites. Because of the amphoteric character, Si can be incorporated without macroscopic doping the AlGaAs. The III-IV-V semiconductor compound is doped with tellurium (Te) or selenium (Se). Preferably, X will be in the range of 0.8-0.98 and Y will be in the range of 0.19-0.01. In a preferred embodiment, X=0.97 and Y=0.01.

The layer 12 is preferably located between adjacent semiconductor layers 14, 16 which are also n-doped. These layers preferably consist of $Al_xGa_{1-x}As$, where X is less than 1. In a preferred embodiment, X=0 such that the layers 14 and 16 are formed of GaAs which is n-doped with a concentration of $5*10^{17}$ cm$^{-3}$.

The concentration of the group IV component Si in the III-IV-V semiconductor compound AlGaSiAs is chosen in such a way that the Fermi-level is balanced in the layers and the tunnel barrier almost vanishes such that low resistance current flow is enabled. Current models show that Si concentration of less 2% is sufficient for balancing the Fermi-level in such a way to keep the strained AlGaSiAs quantum barrier below the critical layer thickness.

To form the highly conductive centered strained current aperture 20 of the III-IV-V semiconductor material, a highly resistive area is formed by selective wet oxidation of the Si and high concentration Al layer 12 containing AlGaSiAs III-IV-V semiconductor compound, as indicated at 22. The oxidation results in AlGaSiO complexes having high resistivity. The highly resistive annular region 22 around the aperture 20 is an effective tunnel barrier for current flow. To avoid scattering losses, the central layer 12 with the aperture 20 is placed in a node of the electromagnetic standing wave pattern of the VCSEL. Preferably, the actual distance from the aperture to the active layer is at least approximately one-quarter wave length, but it is also possible to use larger distances of up to approximately 10 times the emission wave length. The small thickness of the quantum barrier layer 12 results in an extremely low mechanical stress created during the oxidation process.

The optoelectronic device having the highly conductive carrier tunneling current aperture 22 formed of the III-IV-V semiconductor material provides the advantage of reduced series resistance and higher conversion efficiencies with lower dissipated power, as compared to the known devices formed from III-V semiconductor material. Additionally, due to the placement of the III-IV-V semiconductor layer 12 at a node of the standing wave, there are less scattering losses in the resonator and therefore higher differential quantum efficiencies. The overall mechanical stability of the device is also improved due to the lower power dissipation as well as the reduced mechanical stress created by the confining oxide formation of the III-IV-V semiconductor material.

In the first preferred embodiment, the layer 12 has a thickness $t_1$ of 5-20 nm and the adjacent layers 14 and 16 have a thickness $t_2$, $t_3$ of 50-200 nm. The aperture 20 preferably has a diameter d of 0.5-500 microns, and is more preferably in a range of less than 10 microns. The width $\alpha$ of the confining oxide can be from 5-50 microns. However, it will be recognized by those skilled in the art that other sizes can be utilized, if desired.

Preferably, the layers 12, 14 and 16 are grown using molecular beam epitaxy (MBE) during the formation of the optoelectronic device, such as a VCSEL. One such process is described in U.S. Pat. No. 5,493,577, which is incorporated herein by reference as if fully set forth. It is also possible to grow the layers using a metal-organic chemical vapor deposition process.

The use of a III-IV-V semiconductor compound inside the aperture reduces electrical resistance, which is mainly due to band offsets at the heterojunctions. An additional benefit of the present invention is higher processing rates for wet oxidation of the layer 12 due to the high affinity of Si to oxygen. It will be recognized by those skilled in the art that germanium (Ge) could be used in place of silicon (Si) in the n-doped III-IV-V semiconductor material since germanium also has a high affinity for oxygen and a favorable Fermi-level value for low tunneling resistance. Related compounds such as AlGaSiGeAs for the aperture layer are also possible.

Referring now to FIG. 2, a second embodiment of an optoelectronic device 30 (only a portion of which is illustrated) having a highly conductive carrier tunneling current aperture is shown. The current aperture is similar to the current aperture 20 discussed above, but is intended for holes and is p-doped. The highly conductive carrier tunneling current aperture 40 is formed from a layer 32 that is also made of a III-IV-V semiconductor compound, which preferably consists of $Al_XGa_YC_{1-X-Y}As$, where X is less than 1, Y is less 1 and X+Y<1. In a preferred embodiment, X is in the range of 0.8-0.98, Y is in the range of 0.19-0.01. In a preferred embodiment, X=0.9 and Y=0.08.

Preferably, the III-IV-V semiconductor layer 32 is formed between adjacent semiconductor layers 34, 36 that are also p-doped with a concentration of $5*10^{17}$ cm$^{-3}$. Preferably, the layers 34 and 36 are formed of an $Al_XGa_{1-X}As$ material, where X is less than 1, and in a preferred embodiment X=0.

The current aperture 40 is confined in the layer 32 by wet oxidizing an annular outer portion 42 in a similar manner as discussed above in connection with the first preferred embodiment. The thicknesses of the layers $t_1$, $t_2$ and $t_3$ are similar to those discussed above in connection with the first preferred embodiment. The diameter d of the III-IV-V p-doped semiconductor material forming the current aperture 40 is preferably between 0.5 and 500 microns. The widths a of the confirming oxidized portions 42 of the layer 32 are preferably 5-50 microns.

The second preferred embodiment provides the same advantages of the first preferred embodiment with a p-doped III-IV-V semiconductor material, and is preferably epitaxially grown during the formation of the optoelectronic device.

Accordingly, a current aperture in accordance with the present invention can be formed on either side of an active layer in an optoelectronic device, such as a VCSEL, and be doped with the same doping type as the semiconductor layers on that side.

While the present invention has been described in terms of the preferred embodiments, those skilled in the art will recognize that other modifications are within the spirit and scope of the present invention. Accordingly, it will be appreciated by those skilled in the art that changes can be made to the embodiments described above without departing from the broad amount of concept thereof. It is understood, therefore, that the invention is not limited to the particular embodiments disclosed and is intended to cover modifications within the scope and spirit of the present invention as defined by the appended claims.

What is claimed is:

1. An optoelectronic device having a highly conductive carrier tunneling current aperture comprising:

a centrally positioned current aperture formed from a quantum layer made of a III-IV-V semiconductor compound doped with a first doping type, laterally confirmed by an oxide of the III-IV-V semiconductor compound, and adjacent layers formed of a semiconductor material that is doped with the first doping type.

2. The device of claim 1, wherein the III-IV-V semiconductor compound consists of $Al_XGa_YSi_{1-X-Y}As$, where x<1, y<1 and x+y<1.

3. The device of claim 2, wherein III-IV-V semiconductor compound is n-doped.

4. The device of claim 1, wherein the type IV semiconductor material is selected from the group consisting of Carbon, Silicon, and Germanium.

5. The device of claim 1, wherein the quantum layer has a thickness of about 5 nm to 25 nm.

6. The device of claim 1, wherein the quantum layer is placed in anode of a standing wave pattern of the optoelectronic device.

7. The device of claim 1, wherein the III-IV-V semiconductor compound consists of $Al_XGa_YC_{1-X-Y}As$, where x<1, y<1 and x+y<1.

8. The device of claim 7, wherein the III-IV-V semiconductor compound is p-doped.

9. The device of claim 1, wherein the current aperture has a width of 0.5 to 500 microns.

10. The device of claim 1, wherein the device comprises a VCSEL, and the current aperture is located in proximity to an active layer.

11. The device of claim 1, wherein the device has a single mode emission and the current aperture has a width of 0.5 to 10 microns.

* * * * *

UNITED STATES PATENT AND TRADEMARK OFFICE
CERTIFICATE OF CORRECTION

PATENT NO. : 6,548,835 B2 Page 1 of 1
DATED : July 1, 2003
INVENTOR(S) : Jenniges et al.

It is certified that error appears in the above-identified patent and that said Letters Patent is hereby corrected as shown below:

Column 5,
Line 47, "not" should be -- motor --.
Line 60, "claim 1" should be -- claim 11 --.

Column 8,
Line 8, "Callow" should be -- allow --.

Signed and Sealed this

Ninth Day of December, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,548,835 B2
DATED : July 1, 2003
INVENTOR(S) : Jenniges et al.

It is certified that error appears in the above-identified patent and that said Letters Patent is hereby corrected as shown below:

Column 5,
Line 47, "not" should be -- motor --.
Line 60, "claim 1" should read -- claim 11 --.

Column 8,
Line 8, "Callow" should be -- allow --.

Signed and Sealed this

Sixteenth Day of December, 2003

JAMES E. ROGAN
*Director of the United States Patent and Trademark Office*

UNITED STATES PATENT AND TRADEMARK OFFICE
CERTIFICATE OF CORRECTION

PATENT NO.     : 6,548,835 B1                                                     Page 1 of 1
DATED          : April 15, 2003
INVENTOR(S)    : Karl Joachim Ebeling It is certified that error appears in the above-identified patent and that said Letters Patent is hereby corrected as shown below:

This certificate supersedes Certificate of Correction issued December 9, 2003, the number was erroneously mentioned and should be vacated since no Certificate of Correction was granted.

Signed and Sealed this

Sixth Day of April, 2004

JON W. DUDAS
*Acting Director of the United States Patent and Trademark Office*